United States Patent [19]

Aoki et al.

[11] 4,211,942
[45] Jul. 8, 1980

[54] VOLTAGE COMPARATOR PROVIDED WITH CAPACITIVELY CASCADE-CONNECTED INVERTING AMPLIFIERS

[75] Inventors: Kazuhide Aoki; Kenji Kawagai, both of Kawasaki, Japan

[73] Assignee: Tokyo Shibaura Denki Kabushiki Kaisha, Japan

[21] Appl. No.: 925,801

[22] Filed: Jul. 18, 1978

[30] Foreign Application Priority Data

Jul. 18, 1977 [JP] Japan .................... 52-85869

[51] Int. Cl.$^2$ .................... H03K 5/20; H03K 17/60
[52] U.S. Cl. .................... 307/355; 307/240; 307/251; 307/356
[58] Field of Search ............ 307/240, 243, 251, 297, 307/304, 355, 356, DIG. 3

[56] References Cited

U.S. PATENT DOCUMENTS

| | | | |
|---|---|---|---|
| 3,289,093 | 11/1966 | Wanlass | 307/304 X |
| 3,392,341 | 7/1968 | Burns | 307/304 X |
| 3,448,397 | 6/1969 | Lin et al. | 307/304 X |
| 3,676,702 | 7/1972 | McGrogan, Jr. | 307/251 X |
| 3,886,464 | 5/1975 | Dingwall | 330/269 |
| 3,891,936 | 6/1975 | Romeo et al. | 307/304 X |
| 3,916,223 | 10/1975 | Fette et al. | 307/304 X |
| 4,028,558 | 6/1977 | Heller et al. | 307/355 |
| 4,075,509 | 2/1978 | Redfern | 307/355 X |
| 4,097,753 | 6/1978 | Cook et al. | 307/DIG. 3 X |

*Primary Examiner*—Larry N. Anagnos
*Attorney, Agent, or Firm*—Finnegan, Henderson, Farabow, Garrett & Dunner

[57] ABSTRACT

A voltage comparator suitable for use in an analog-to-digital converter such as a successive-approximation converter, and provided with capacitively cascade-connected inverter stages to produce an output signal of a logic level 1 or 0 according to the relationship between the magnitudes of two analog input voltage signals to be compared. A first series circuit of an MOS switching transistor and resistive element is connected between the input and output of the respective inverters; a second series circuit of a MOS switching transistor and resistive element is connected between the input of each inverter and circuit ground. The MOS transistors of the first and second series circuits are simultaneously enabled or disabled by a clock pulse; and two input voltage signals to be compared are alternately applied to the first stage coupling capacitor.

3 Claims, 4 Drawing Figures

VOLTAGE COMPARATOR PROVIDED WITH CAPACITIVELY CASCADE-CONNECTED INVERTING AMPLIFIERS

BACKGROUND OF THE INVENTION

This invention relates to a voltage comparator, and more particularly to a voltage comparator having a plurality of capacitively cascade-connected inverting amplifiers.

An analog-to-digital converter (hereinafter referred to as "an A/D converter") such as a successive—approximation converter already known in the art comprises a comparator for comparing an unknown analog voltage Va supplied from a sample-and-hold circuit with a corresponding output voltage Vo from a digital-to-analog (D/A) converter which approximates the unknown analog voltage Va from the sample-and-hold circuit. This voltage comparator produces an output signal of a logic level 1 or 0 according to the relationship between the magnitudes of the voltage signals Va and Vo being compared. As is well known, an output signal from the comparator is conducted to a register section of the A/D converter.

FIG. 1 shows the arrangement of a prior art comparator used in a successive-approximation A/D converter including capacitively cascade—connected inverting amplifiers. The conventional comparator comprises N stages of inverting amplifiers. The respective amplifier stages are comprised of MOS inverters 1-1, 1-2,—and 1-N and coupling capacitors 2-1, 2-2,—and 2-N. The inputs of inverters 1-1, 1-2,—and 1-N are connected through source-to-drain paths of MOS transistors 3-1, 3-2,—and 3-N to the dividing point of a voltage divider formed of resistors $R_a$ and $R_b$ which may be formed by MOS transistor and connected across a power source $V_D$. The two voltage signals Vo and Va to be compared are alternately applied to the coupling capacitor 2-1 of the first stage amplifier through source-to-drain paths of MOS transistors 4 and 5. A clock pulse $\phi$ is delivered to the gate electrodes of MOS transistors 3-1, 3-2, 3-N and 4, and a complementary clock pulse $\bar{\phi}$ is supplied to the gate electrode of MOS transistor 5. In FIG. 1, the MOS transistors are of the N-channel type, and the MOS inverters are each formed, as is well known, of an N-channel driving MOS transistor and an N-channel load MOS transistor. Further, all the above-mentioned MOS transistors are of the enhancement type. The MOS transistors 3-1, 3-2, 3-N and 4 are enabled and MOS transistor 5 is disabled when the clock pulse $\phi$ goes high. Conversely, when the clock pulse $\phi$ goes low, that is, when the complementary clock pulse $\bar{\phi}$ goes high, the MOS transistor 5 is enabled, whereas the MOS transistors 3-1, 3-2, 3-N and 4 are disabled. As a result, the voltage signals Vo and Va are alternately coupled to the first stage amplifier during the cycle period of clock pulses $\phi$ and $\bar{\phi}$.

When the MOS transistors 3-1, 3-2 and 3-N are enabled, the inputs of MOS inverters are biased to an output voltage $V_{bias}$ from the voltage divider. Since, at this time, the MOS transistor 4 is enabled, the output voltage Vo from the D/A converter included in the successive-approximation A/D converter is applied to the first stage coupling capacitor 2-1, which in turn is charged to Vo-$V_{bias}$. When the clock pulse $\bar{\phi}$ goes high, the unknown analog voltage Va from the sample-and-hold circuit which is to be converted into a digital signal is supplied to the first stage coupling capacitor 2-1 in place of the output voltage Vo from the D/A converter. At this time, the MOS transistor 3-1 is rendered nonconducting to interrupt the discharging path for the first stage coupling capacitor 2-1. As a result, an input potential of the MOS inverter 1-1 is changed so as to maintain the voltage Vo-$V_{bias}$ across the capacitor 2-1. Thus, the input potential of the MOS inverter 1-1 is changed from the voltage $V_{bias}$ by the extent of Va-Vo. This potential change is progressively invert-amplified through the cascade-connected inverting amplifiers. The level of an output voltage from the last stage amplifier is defined by the relationship between the magnitudes of the two voltage signals Vo and Va being compared as well as by an odd or even number of inverting amplifiers used. The number of the inverting amplifiers can be reduced more, according as the inverting amplifier has a larger amplification factor. The above-mentioned prior art voltage comparator can be integrated with other circuits on a semiconductor chip.

FIG. 2 shows a typical transfer characteristic or input-output characteristic of an inverter. As seen from FIG. 2, each of the inverting amplifiers included in the comparator operates in the best mode when its operation point is set by the bias voltage $V_{bias}$ at the central point P of the transition region of transfer characteristic lying between the output logic levels 1 and 0. Inverters 1-1, 1-2, 1-N formed on the same semiconductor chip have substantially the same transfer characteristic. However, inverters formed on different semiconductor chips unavoidably indicate unequal transfer characteristics due to manufacturing process variations. Further, the resistance values of resistors Ra and Rb constituting the voltage divider vary from chip to chip. Since the supply voltage $V_D$ used is considered to remain unchanged for a number of semiconductor chips manufactured, the manufacturing process variations may cause the operation point of the inverter to be displaced from the optimum point. In the worst case, where, for example, the transition region of the transfer characteristic curve is inclined prominently, then the inverter is operated at the point where the bias voltage $V_{bias}$ causes an output voltage signal always to have a logic level of either 1 or 0. In such case, the comparator fails to be properly operated.

SUMMARY OF THE INVENTION

It is accordingly an object of this invention to provide an improved voltage comparator provided with capacitively cascade-connected inverting amplifiers.

Another object of the invention is to provide an improved voltage comparator with capacitively cascade-connected inverting amplifiers suitable for use in integrated circuits.

Still another object of the invention is to provide an improved voltage comparator provided with capacitively cascade-connected inverting amplifiers which can always be operated under stable conditions.

A voltage comparator embodying this invention comprises a plurality of capacitively cascade-connected inverting amplifiers and an input circuit for alternately coupling two input voltage signals to be compared to the first stage inverting amplifier. Each inverting amplifier stage comprises a MOS inverter; a first series circuit of a MOS switching transistor and resistive element connected between the input and output of the inverter; a second series circuit of a MOS switching transistor and a resistive element connected between the input of the inverter and circuit ground, and an input coupling capacitive element connected to the input of the inverter.

The MOS switching transistors included in the first and second series circuits are simultaneously enabled or disabled in response to a clock pulse supplied to the gate electrodes thereof.

The input circuit is arranged alternately to couple two input voltage signals to the input capacitive element of the first stage inverting amplifier, and provided with MOS switching transistors alternately enabled or disabled in response to a clock pulse supplied to the gate electrodes thereof.

The voltage comparator of this invention is suitable for use in an A/D converter such as a successive—approximation A/D converter. In this case, an output voltage signal from a sample-and-hold circuit which is to be converted into a digital signal is supplied to the voltage comparator as an analog input voltage signal. The analog voltage signal delivered from the sample-and-hold circuit retains a fixed value during A/D conversion. Another input voltage signal supplied to the voltage comparator is an output voltage signal from a digital-to-analog converter for converting an output digital signal from a register section of the A/D converter into an analog signal. The latter input voltage signal supplied to the voltage comparator changes in voltage during the A/D conversion as output voltage signal from the voltage comparator having a logic level 1 or 0 is conducted to the register section of the A/D converter.

A voltage comparator embodying this invention is suitable for a monolithic integrated circuit version. The resistive elements of the first and second series circuits can be formed of MOS transistors.

DESCRIPTION OF THE PREFERRED EMBODIMENTS

Figure 1:
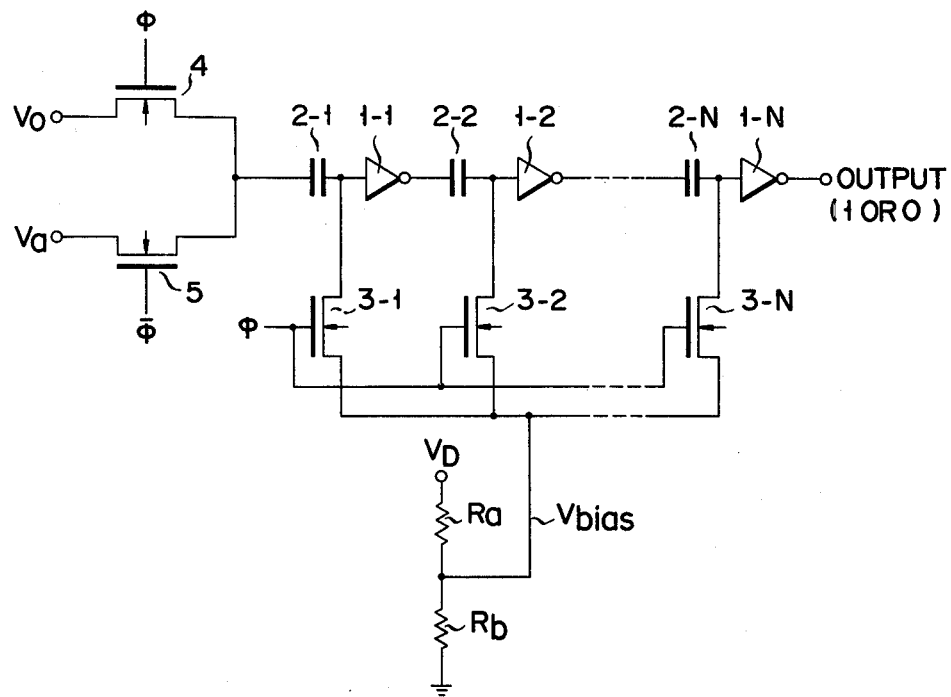
FIG. 1 shows a circuit arrangement of a prior art voltage comparator.
Figure 2:
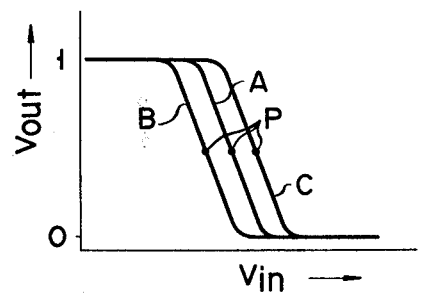
FIG. 2 indicates transfer characteristics of MOS inverting amplifiers used in the voltage comparator of FIG. 1, which result from manufacturing process variations.
Figure 3:
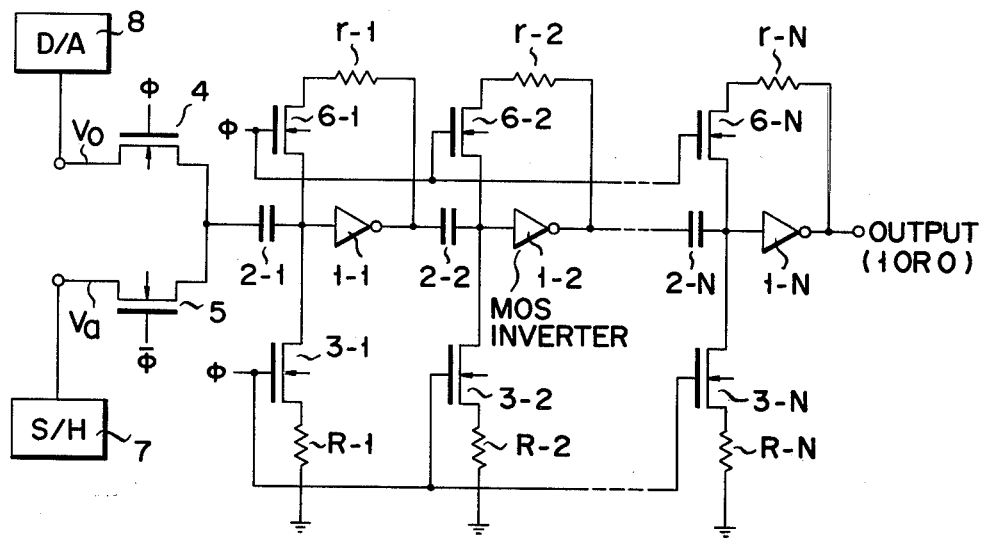
FIG. 3 is a circuit diagram of a voltage comparator embodying this invention.

The parts of FIG. 3 showing one embodiment of this invention which are the same as those of FIG. 1 are designated by the same numerals. According to the embodiment of FIG. 3, a first series circuit of a resistive element r-1 and an N-channel MOS transistor 6-1 is connected between the input and output of the first stage MOS inverter 1-1. A second series circuit of an MOS transistor 3-1 and resistive element R-1 is connected between the input of the first stage MOS inverter 1-1 and circuit ground or referential potential point. A series circuit of a resistive element r-2 and MOS transistor 6-2 is connected between the input and output of a second MOS inverter 1-2. A series circuit of an MOS transistor 3-2 and resistive element R-2 is connected between the input of the second stage MOS inverter 1-2 and circuit ground. Like the first and second stage inverters, the succeeding stages thereof respectively include first and second series circuits of an MOS transistor and resistive element. Similarly, a first series circuit of a resistive element r-N and MOS transistor 6-N is connected between the input and output of the last stage inverter 1-N. A second series circuit of a resistive element R-N and MOS transistor 3-N is connected between the last stage inverter 1-N and circuit ground. The gate electrodes of MOS transistors 6-1, 6-2 and 6-N are supplied with a clock pulse $\phi$ like those of the MOS transistors 3-1, 3-2 and 3-N. Accordingly, the MOS transistor of the first series circuit and that of the second series circuit are simultaneously enabled or disabled.

For an integrated circuit version, it is preferred that with the embodiment of FIG. 3, the resistive elements r-1, r-2 and r-N should have the same resistance r, and the resistive elements R-1, R-2 and R-N should have the same resistance R. These resistive elements may also be formed of MOS transistors.

Now let it be assumed that when, with the embodiment of FIG. 3, a clock pulse $\phi$ has a low voltage level, namely, when the MOS transistors of the series circuits are disabled, an output voltage from the inverters is indicated by $V_{out}$; and when the clock pulse $\phi$ has a high voltage level, namely, when the MOS transistors of series circuits are enabled, an input voltage of the inverters is represented by $V_{in}$. Then the input voltage $V_{in}$ is determined from the following equation:

$$V_{in}=(R/r+R)V_{out} \qquad (1)$$

Figure 4:
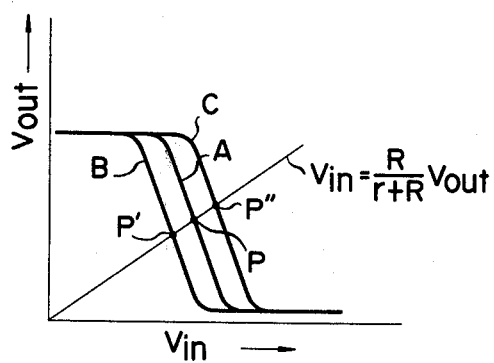
FIG. 4 illustrates a process of compensating for the displacement of the operation point of the MOS inverters of the voltage comparator of FIG. 3 which is caused by variations in the transfer characteristic of MOS inverters resulting from manufacturing process variations.

Proper selection of the resistance of the resistive elements r and R enables the operation point of the inverters to be set, as shown in FIG. 4, at the central point P of the transition region of a typical transfer characteristic A. Even where the transfer characteristic of the inverters varies from chip to chip as indicated at B and C of FIG. 4, the operation point of the inverters can be set, as shown by P' and P'', substantially at the central point of each transfer characteristic. Therefore, the voltage comparator embodying this invention operates satisfactorily, even when the transfer characteristic of the inverters varies from chip to chip.

According to the embodiment of FIG. 3, an analog voltage signal Va (having a fixed voltage level during the A/D conversion) supplied from the sample-and-hold circuit 7 acting as a source of an analog input signal, and an input voltage signal Vo (whose voltage level varies with time during the A/D conversion) delivered from the D/A converter 8 acting as another source of an analog input signal are alternately coupled to the coupling capacitor 2-1 of the first stage inverting amplifier. When a clock pulse $\phi$ has a high voltage level, namely, when the MOS transistor 4 is enabled, the coupling capacitor 2-1 thereof has a charge whose amount is calculated from the following equation (2)

$$Q=C(V_o-V_{in}) \qquad (2)$$

where C denotes the capacitance of the first stage capacitor 2-1.

Now let it be assumed that when a complementary clock pulse $\bar{\phi}$ has a high voltage level, namely when the MOS transistor 5 is enabled, an input voltage signal supplied to the first stage inverting amplifier 1—1 is represented by $V'_{in}$. Then the charge Q stored in the coupling capacitor 2-1 is expressed by the following equation:

$$Q = C(V_o - V_{in}) \qquad (3)$$

Derived, therefore, from the above equations (2), (3) the following equation:

$$V'_{in} = V_{in} + (V_o - V_a) \qquad (4)$$

Namely, the voltage level of an input voltage signal supplied to the first stage inverter 1-1 changes from $V_{in}$ by the extent of $V_o - V_a$. This change is progressively invert-amplified. As previously mentioned an N number of inverting amplifiers are cascade-connected. Therefore, the last stage inverter 1-N produces an output digital signal having a logic level 1 or 0 according to the relationship between the magnitudes of two analog input voltage signals $V_o$ and $V_a$ being compared. If N denotes an odd number, then the output digital signal has a logic level 0 in case of $V_a > V_o$, and a logic level 1 in case of $V_o > V_a$. If N shows an even number, then the output digital signal has a logic level 1 in case of $V_a > V_o$ and a logic level 0 in case of $V_o > V_a$.

A required number of inverting amplifiers depends on an amplification factor of inverters used. The amplification factor of inverters is defined by the relationship between the width-to-length ratio of channel in a MOS driver transistor and that of the channel in a MOS load transistor.

A voltage comparator embodying this invention has been described by reference to the case where n-channel MOS transistors were used. However, the voltage comparator may be formed of p-channel MOS transistors or complementary MOS transistors. The MOS transistor 5 included in the input circuit may be adapted to be simultaneously enabled or disabled with the MOS transistors of the first and second series circuits.

What we claim is:

1. A comparator for comparing a first input voltage signal with a second input voltage signal to provide at an output thereof an output signal of a logic level 1 or 0 depending on the relationship between magnitudes of the first and second input voltage signals comprising:
    a plurality of capacitively cascade-connected inverting amplifier stages each including an inverter having an input and an output, a first series connection of a first resistive impedance element and a first switching device connected between said input and output of said inverter, a second series connection of a second resistive impedance element and a second switching device connected between said input of said inverter and a reference potential circuit point, and an input-coupling capacitive element connected to said input of said inverter, said first and second switching devices of said first and second series connections being simultaneously enabled or disabled at a predetermined time interval by a clock pulse signal applied thereto; and
    input circuit means for alternately coupling the first and second input voltage signals to an input-coupling capacitive element of a first inverting amplifier stage, said input circuit means being arranged to couple the first input voltage signal to said input-coupling capacitive element of said first inverting amplifier stage when said first and second switching devices are enabled, and to couple the second input voltage signal to said input coupling capacitive element of said first inverting amplifier stage when said first and second switching devices are disabled.

2. A comparator for comparing a first input voltage signal with a second input voltage signal to provide at an output an output voltage signal of logic level 1 or 0 depending on the relationship between magnitudes of the first and second volage signals comprising:
    a plurality of capacitively cascade-connected inverting amplifier stages each including a MOS inverter having an input and an output, a first series connection of a first resistive impedance element and a first MOS transistor having its source-drain path connected in series with said first resistive impedance element connected between said input and said output of said inverter, a second series connection of a second resistive impedance element and a second MOS transistor having its source-drain path connected in series with said second resistive impedance element connected between said input of said inverter and a reference potential circuit point, and an input coupling capacitive element connected to the input of said MOS inverter;
    a first source of the first input voltage signal;
    a second source of the second input voltage signal;
    a third MOS transistor having its source-drain path connected between said first source and the input coupling capacitive element of a first inverting amplifier stage;
    a fourth MOS transistor having its source-drain path connected between said second source and said input coupling capacitive element of said first inverting amplifier stage; and
    means for applying clock pulses to gate electrodes of said first through fourth MOS transistors so that said first and second MOS transistors in each of said inverting amplifier stages and said third MOS transistor are enabled and said fourth MOS transistor is disabled during a first time interval, and said fourth MOS transistor is enabled and said first through third MOS transistors are disabled during a second time interval following the first time interval.

3. A comparator according to claim 2 wherein said first through fourth MOS transistors have the same channel type.

* * * * *